(12) United States Patent
Ng-Thow-Hing

(10) Patent No.: US 7,409,322 B2
(45) Date of Patent: Aug. 5, 2008

(54) MASS SET ESTIMATION FOR AN OBJECT USING VARIABLE GEOMETRIC SHAPES

(75) Inventor: Victor Ng-Thow-Hing, Mountain View, CA (US)

(73) Assignee: Honda Motor Co., Ltd., Tokyo (JP)

( * ) Notice: Subject to any disclaimer, the term of this patent is extended or adjusted under 35 U.S.C. 154(b) by 665 days.

(21) Appl. No.: 10/877,713

(22) Filed: Jun. 24, 2004

(65) Prior Publication Data

US 2004/0261501 A1 Dec. 30, 2004

Related U.S. Application Data

(60) Provisional application No. 60/483,439, filed on Jun. 26, 2003.

(51) Int. Cl.
*G06F 17/50* (2006.01)
(52) U.S. Cl. .......................................... 703/1; 73/32 R
(58) Field of Classification Search .................. 703/1, 703/2; 434/247; 482/8; 73/32
See application file for complete search history.

(56) References Cited

U.S. PATENT DOCUMENTS 4,161,876 A * 7/1979 Carpenter ................. 73/65.08
7,024,264 B2 * 4/2006 Matsushita et al. ............ 700/98

FOREIGN PATENT DOCUMENTS

JP 5-114011 A 5/1993

OTHER PUBLICATIONS (Anatomically Based Models for Physical and Geometry Reconstruction of Humans and other Animals, by Victor Ng-Thow-Hing, 2001).*
Prince et al., (Hierarchical Reconstruction Using Geometry and Sinogram Restoration, IEEE Jul. 1993).*
Petros Faloutsos, Composable Controllers for Physics-Based Cahracter Animation, 2002.*
Baruh, H., Analytical Dynamics, Section 6.4: Transformation Properties, WCB McGraw-Hill, 1999, pp. 334-343.

(Continued)

*Primary Examiner*—Zoila E. Cabrera
*Assistant Examiner*—Andre Pierre Louis
(74) *Attorney, Agent, or Firm*—Fenwick & West LLP; Mark Duell

(57) ABSTRACT

A system and method for object modeling. A compositing module embeds geometric shapes to model varying densities of an object. The compositing module represents each volume domain of constant density within a segment with a separate geometric shape. A mass set properties module in the system calculates estimates of mass set properties such as center of mass by first subtracting integrals related, for example, to the lungs from an integral related to the total chest cavity. A deforming module in the system provides a geometric shape that is deformable to more closely match data points from the object. The deforming module adjusts a B-spline solid having control points to fit an irregularly shaped object. Movement and location of the control points locally adjust the B-spline solid's surface. These variation can be used to determine mass set properties including mass, volume, center of mass, inertia tensors, principal moments, and the like.

35 Claims, 8 Drawing Sheets

OTHER PUBLICATIONS

Hanavan, E.P., *A Mathematical Model of the Human Body*, Aerospace Medical Research Labs, Technical Report (TR-64-102), Wright-Patterson Air Force Base, OH, 1964.

Henderson, D., *Estimating the Masses and Centers of Mass of Extinct Animals by 3-D Mathematical Slicing*, Paleobiology, 25(1), 1999, pp. 88-106.

International Search Report and Written Opinion of the International Searching Authority, PCT/IB 2004/003069, Jun. 25, 2004.

Lee, Y.T., et al., *Algorithms for Computing the Volume and Other Integral Properties of Solids, I. Known Methods and Open Issues*, Communications of the ACM, vol. 25, No. 9, Sep. 1982, ACM Press, US, pp. 635-641.

Lee, Y.T., et al., *Algorithms for Computing the Volume and Other Integral Properties of Solids, II. A Family of Algorithms Based on Representation Conversion and Cellular Approximation*, Communications of the ACM, vol. 25, No. 9, Sep. 1982, ACM Press, US, pp. 642-650.

Mirtich, B., *Fast and Accurate Computation of Polyhedral Mass Properties*, Journal of Graphics Tools, 1(2), 1996, pp. 31-50.

Ng-Thow-Hing, V. and Fiume, E., *Interactive Display and Animation of B-Spline Solids as Muscle Shape Primitives*, Proceedings of Computer Animation and Simulation '97, pp. 81-97.

Nigg, B., Biomechanics of the Musculo-skeletal System, $2^{nd}$ ed., Editors B. Nigg and W. Herzog, Section 3.9: *Inertial Properties of the Human or Animal Body*, John Wiley and Sons, 1999, pp. 376-399.

Press, W. et al., Numerical Recipes in C: The Art of Scientific Computing, $2^{nd}$ ed., Section 11.1: *Jacobi Transformations of a Symmetric Matrix*, Cambridge University Press, 1992, p. 463-469.

Yeadon, M.R. and Morlock, M., *The Appropiate Use of Regression Equations for the Estimation of Segmental Inertia Parameters*, J. Biomechanics, 22 (6-7), 1989, pp. 683-689.

* cited by examiner

MASS SET ESTIMATION FOR AN OBJECT USING VARIABLE GEOMETRIC SHAPES

CROSS REFERENCE TO RELATED APPLICATION

This application is related to U.S. Provisional Patent Application No. 60/483,439, filed on Jun. 26, 2003, entitled "Mass Sets For Interactive Computation Of Inertial Parameters For Rigid And Deformable Body Segments For Humans and Humanoid Robots," by Victor Ng-Thow-Hing, from which priority is claimed under 35 U.S.C. § 119(e) and the entire contents of which are herein incorporated by reference.

BACKGROUND OF THE INVENTION

1. Field of the Invention

This invention pertains generally to object modeling, and more particularly, to calculating mass property estimations for an object by using variable geometries to represent nonuniform densities and/or irregular shapes.

2. Description of Related Art

Computer modeling of objects such as humans, humanoid robots, animals (e.g., extinct animals), and the like, provides a powerful tool set for numerous applications. For example, human models can simulate the performance of dangerous activities prior to exposing a human to the activity. Humanoid robot models can simulate the performance of ordinary tasks, and be adjusted for improvements, prior to building a physical prototype. Also, extinct animal models can offer valuable insight for species that are impossible to observe in nature.

One difficultly with conventional computer modeling techniques lies in creating dynamic simulations of objects in motion. Because these models are virtual and are limited only by imagination, it is difficult to realistically access effects of physical characteristics, such as mass, volume, center of mass, inertia tensors, moments and the like. In other words, while it is currently possible to simulate a humanoid robot walking up a set of virtual stairs, there needs to be a way of simulating physical characteristics of this activity that would be presented in the real world. Inaccuracies can result in wasted efforts to build a prototype robot that cannot perform desired functions.

Current techniques used to model mass properties are problematic. Experimental methods attempt to directly measure properties from body segment specimens. For example, the photographic suspension method was used to determine the center of gravity of horse body parts. However, for this method, the specimen typically must be in a cadaveric state with all body segments disassembled. To overcome the need of specimens in cadaveric state, non-invasive approaches that use imaging technology such as CAT can be applied to virtually compute mass properties from image slices with tissue density maps. Unfortunately, this process is often expensive and time consuming. Another application develops human dynamic models for subject-specific simulation. Although one can use regression models, they do not account for specific variations in individual subjects because regression is based on statistical averages. In addition, the methods mentioned above require the existence of real specimens, which limits their application. Current geometric approaches typically require regular geometric shapes and uniform densities that are not accurate for reliable physical simulation.

Therefore, there is a need for a robust system and method of modeling objects using geometric shapes that can be varied to represent objects of nonuniform densities and/or irregular shape to provide accurate mass property estimation.

SUMMARY OF THE INVENTION

The present invention provides a system and method for object modeling to meet the above needs. Advantageously, the system provides computationally efficient and accurate mass set property estimation for an object having nonuniform density and/or irregular shapes. In one embodiment, the system embeds geometric shapes to model varying densities of an object. In another embodiment, the system provides a geometric shape that is deformable to more closely match data points from the object. These variations can be used to determine mass set properties including mass, volume, center of mass, inertia tensors, principal moments, and the like.

In yet another embodiment, to model nonuniform density within a segment, a compositing module in the system represents each volume domain of constant density with a separate geometric shape. For example, a human chest cavity comprises two main volume domains, muscle tissue and lungs. The compositing module represents associated densities separately by, selecting a geometric shape that represents the chest cavity as a whole, and then selecting additional embedded geometric shape to represent each the right and left lung.

In one embodiment, a mass set properties module in the system calculates mass sets such as center of mass by first subtracting integrals related to the lungs from an integral related to the total chest cavity. If necessary, integrals for the lungs using an appropriate density can be added back to the total integral. However, in the case of lungs, the density of air is negligible relative to the density of muscle tissue.

In still another embodiment, a deforming module in the system adjusts initial geometric shapes to fit an irregularly shaped object. The deforming module provides a B-spline solid having control points. Movement and location of the control points locally adjust the B-spline solid's surface. Accordingly, the control points have the most influence on the nearest surface area with diminishing influence over further distances. For example, body parts such as a chest cavity or foot are unlikely to be accurately fit by predefined polyhedral shapes. By adjusting control points, a predefined ellipsoid can be locally deformed to more tightly fit the actual shape of the modeled chest cavity or foot.

In one embodiment, the mass properties module determines a center of mass or inertia tensor for each segment having a deformed shape using a local coordinate system. The mass properties module translates each of the local coordinates to a common reference. The mass properties module estimates an overall center of mass or inertia tensor of the object by combining the translated references.

The features and advantages described in the specification are not all inclusive and, in particular, many additional features and advantages will be apparent to one of ordinary skill in the art in view of the drawings, and specification. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

A system and method for object modeling is disclosed. The system according to some embodiments of the present invention is set forth in FIG. 1, and the method according to some embodiments of the present invention is set forth in FIGS. 2-7. The accompanying description is for the purpose of providing a thorough explanation with numerous specific details. Of course, the fields of object modeling and mass property estimation are such that many different variations of the illustrated and described features of the invention are possible. Those skilled in the art will thus undoubtedly appreciate that the invention can be practiced without some specific details described below, and indeed will see that many other variations and embodiments of the invention can be practiced while still satisfying its teachings and spirit. Accordingly, the present invention should not be understood as being limited to the specific implementations described below, but only by the claims that follow.

The processes, features, or functions of the present invention can be implemented by program instructions that execute in an appropriate computing device. Example computing devices include enterprise servers, application servers, workstations, personal computers, network computers, network appliances, personal digital assistants, game consoles, televisions, set-top boxes, premises automation equipment, point-of-sale terminals, automobiles, and personal communications devices (e.g., cellular handsets).

The program instructions can be distributed on a computer readable medium or storage volume. The computer readable storage volume can be available via a public network, a private network, or the Internet. Program instructions can be in any appropriate form, such as source code, object code, or scripting code.

Figure 1:
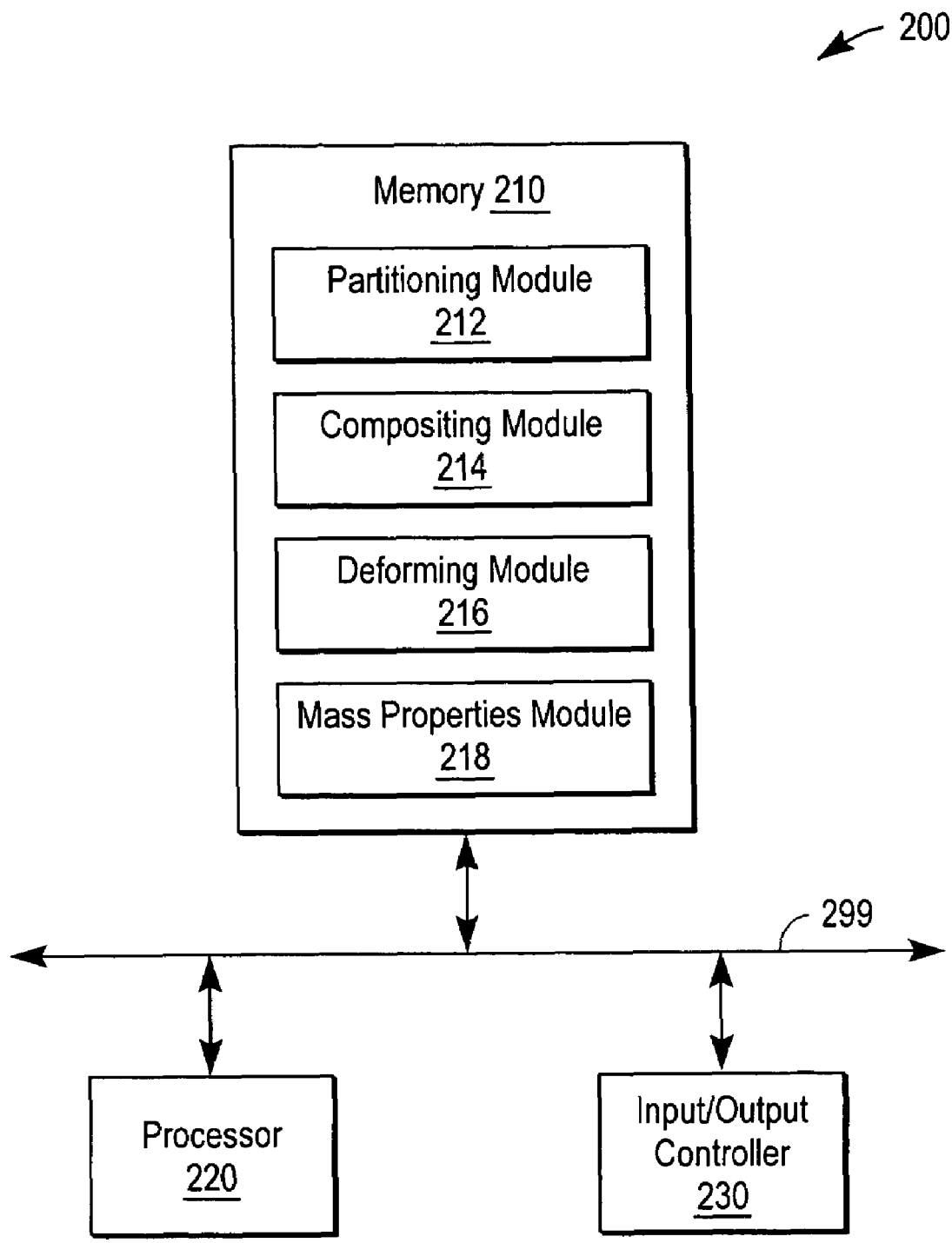
FIG. 1 is a block diagram illustrating a system for object modeling using variable geometric shapes according to one embodiment of the present invention.

FIG. 1 is a block diagram illustrating a system 200 for object modeling using variable geometric shapes according to one embodiment of the present invention. The system 200 can be embodied in, for example, a computer or other general purpose device, a dedicated modeling device, and the like. The system 200 can be employed for many applications. For example, by determining mass properties of nonuniform density and/or irregularly shaped objects, the system 200 can use a center of mass (COM) to estimate the posture of extinct animals. In another example, the system 200 can aid robot design by modeling a robot walking up a flight of simulated stairs. In still another example, the system 200 can provide realistic animation of moving objects.

The system 200 comprises a memory 210, a processor 220, and an input/output controller 230 coupled in communication through a bus 299. The memory 210, comprising a hard disk, random access memory, or the like, provides nonvolatile and/or volatile storage of software instructions and data. The processor 220, comprising a ×386-type processor, an application specific integrated circuit, a microcontroller, or the like, executes the software instructions and manipulates the data. The input/output controller 230, comprising a keyboard or mouse input, a display output, a communication device, or the like, receives data from and sends data to input and output devices.

In the present embodiment, the memory 210 further comprises a partitioning module 212, a compositing module 214, a deforming module 216, and a mass properties module 218. Generally, the partitioning module 212 selects geometric shapes to represent an object segments being modeled. The compositing module 214 selects and embeds several geometric shapes to represent nonuniform densities of an object. Each of the geometric shapes can represent a single volume of density. The deforming module 216 adjusts geometric shapes, such as B-spline solids, to fit an object. By moving control points, the deforming module 216 locally adjusts a predefined geometric shape to match data points of the object. The mass properties module 218 calculates mass property estimations based on geometric shapes. Each of these components within the memory 210, and associated methods, are discussed in further detail below.

Figure 2:
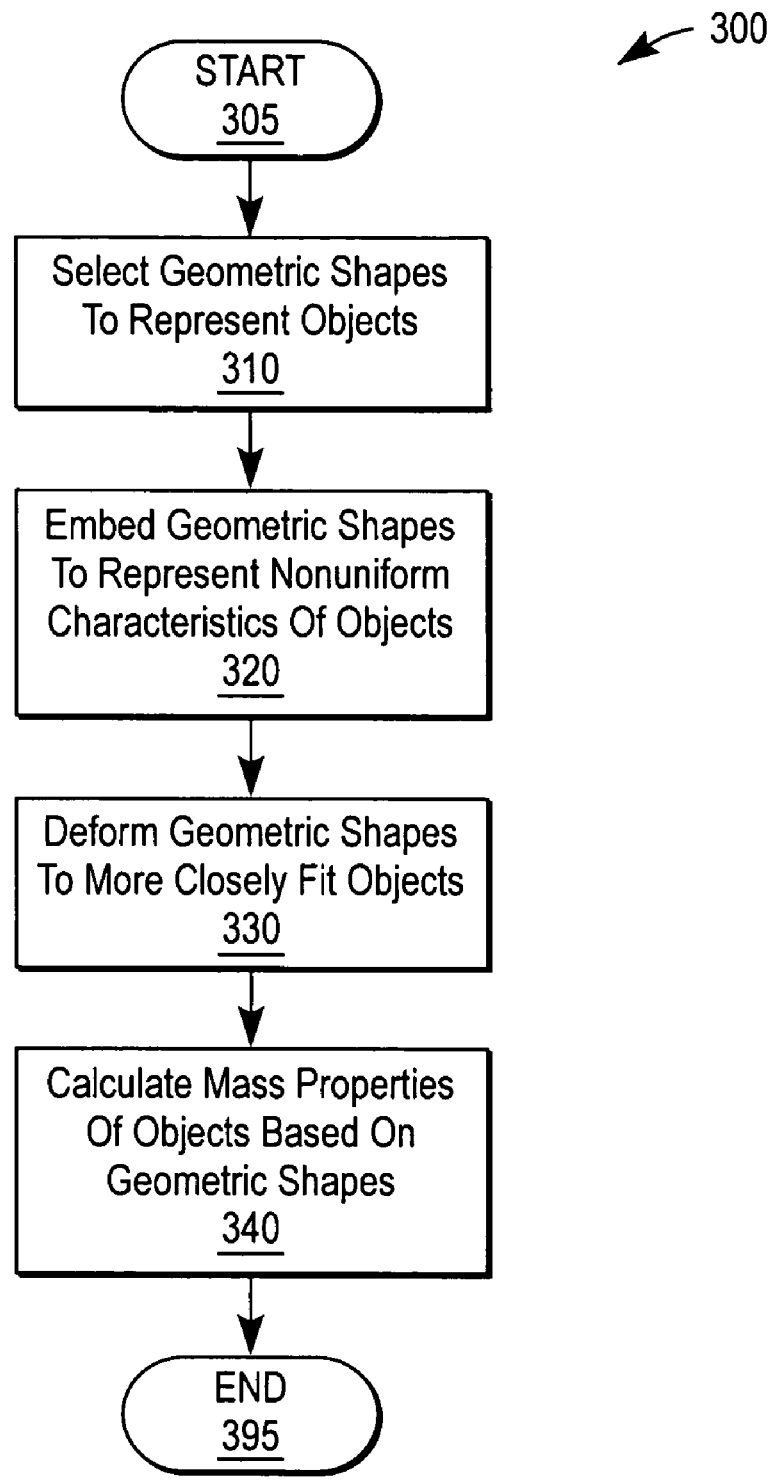
FIG. 2 is a flow chart illustrating a method for object modeling using variable geometric shapes according to one embodiment of the present invention.

FIG. 2 is a flow chart illustrating a method 300 for object modeling using variable geometric shapes according to one embodiment of the present invention. The partitioning module 212 selects 310 geometric shapes to represent volumes of an object being modeled. The object is the subject matter for which the system 200 estimates mass properties. The object can be a real-world, physical object such as a human, an animal, a skeleton, a robot, a building, and the like. Modeling software translates physical objects to virtual objects, such as an articulated figured, that can be displayed on a computer screen. The object can also be computer-generated, such as an animation, a CAD model, a 3-dimensional shape, and the like. Either way, the system 200 uses 3-dimensional data points that represent an object as an input.

Figure 3:
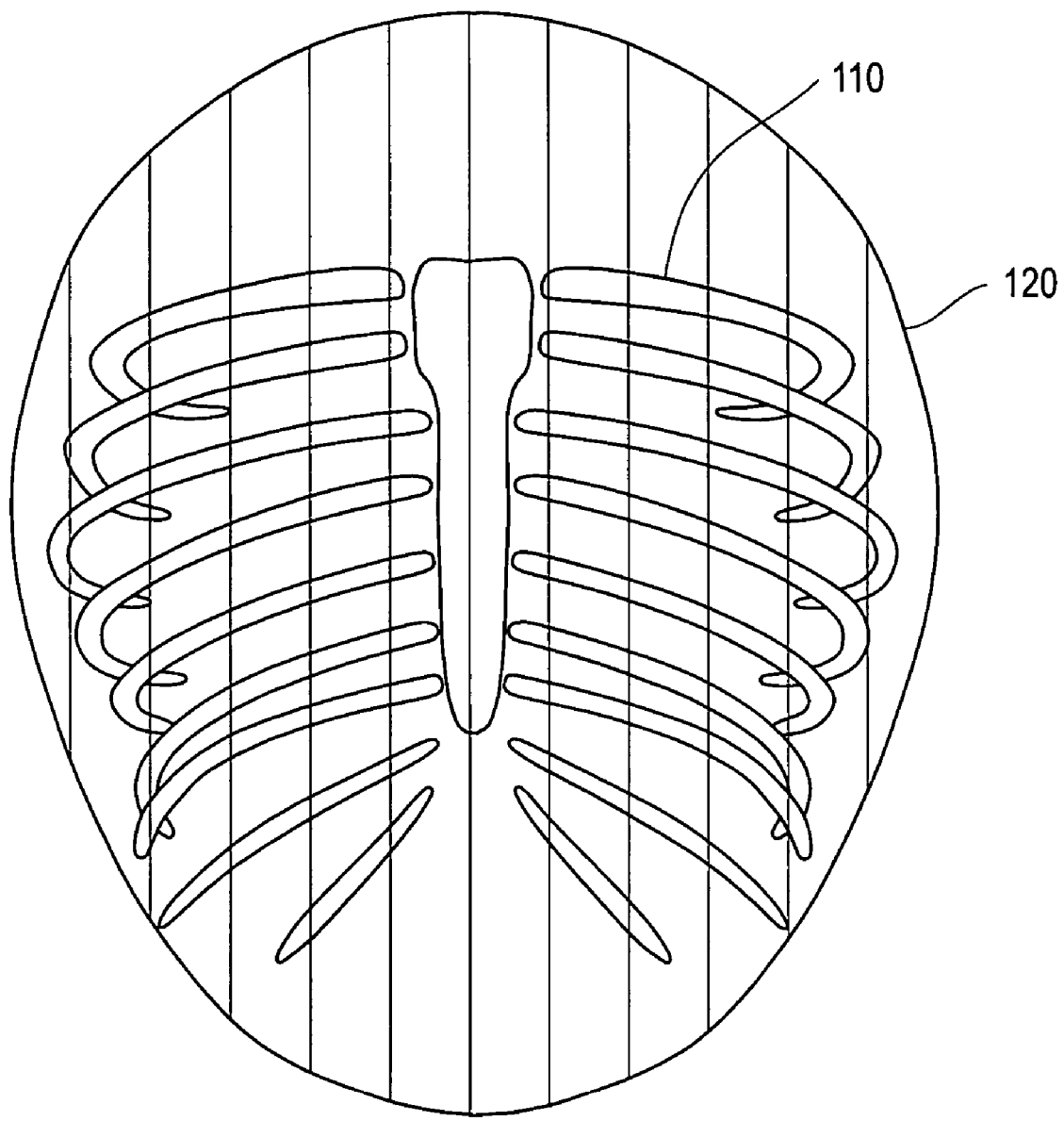
FIG. 3 is an illustration of an example segment represented by an example geometric shape according to one embodiment of the present invention.

The partitioning module 212 partitions the object into segments using logical divisions such as joints of a human skeleton. The divisions can be detected, for example, automatically using data point density distributions or a user can manually indicate segment boundaries. The partitioning module 212 initially fits each detected segment with a predefined geometric shape. FIG. 3 is an illustration of an example segment 110 with an example predefined geometric shape 120. More particularly, the segment 110 comprises a human chest cavity that the partitioning module 212 has segmented from other parts of the skeleton. Other segments of a human skeleton may comprise a right or left arm, a right or left leg, a right or left hand, a right or left foot, a head, a hip, a neck, and the like.

In one embodiment, the geometric shapes are polyhedron including ellipsoidal, cylindrical, rectangular shapes, and the like. In another embodiment geometric shapes are composites of several shapes such as a cube combined with a half sphere on one face. The predefined shapes are adjustable as rigid polyhedrals to more closely fit data points by changing dimensions such as radius, length, height, and width, and also by changing orientation such as rotation along the x-, y-, or z-axes. B-spline shapes are preferred over rigid polyhedrals where an error between the predefined shape and actual data points produces an unacceptable error. Ultimately, the system 200 uses geometric shapes to determine mass properties.

In one embodiment, the compositing module 214 embeds 320 additional geometric shapes to represent estimations of nonuniform densities of an object. Prior art systems forfeit accuracy by using a single volume to represent nonuniform densities. However, many objects are composed of multiple elements having differing densities. For example, a human leg is a segment that is composed of both bone and muscle tissue. Similarly, a robot leg is a segment that is composed of both metal and plastic. By representing the bone or metal with a first or primary geometric shape, and the muscle or plastic with a second or secondary geometric shape, resulting mass property estimations are more accurate. Additional embodiments of the method for embedding 320 geometric shapes is described in further detail below with respect to FIG. 4.

In one embodiment, the deforming module 216 adjusts 330 the initial geometric shapes to fit an irregularly shaped object. Regularly shaped objects are able to be fitted predefined polyhedron shapes within an acceptable error. One metric of error employs root mean square calculations to indicate distances between shape surfaces and data points. When the amount of error is unacceptable, the deforming module 216 can provide a B-spline solid which permits customization of the geometric shape to more closely fit data points of the object. More specifically, movement of control points associated with the B-spline locally adjusts the surface. As a result, the mass properties of the deformed geometric shapes are more accurate estimations of the object than predefined shapes. Additional embodiments of the method for adjusting 330 geometric shapes is described in further detail below with respect to FIG. 6.

The mass properties module 218 calculates 340 mass property estimations based on geometric shapes. The mass properties include mass volume, center of mass, inertia tensor, principal moments of body segments, and the like. In one embodiment, the mass properties module 218 assigns a value to each geometric shape corresponding to a density of the object or segment therein. The mass properties module 218 calculates mass properties from the volume of the geometric shape and the assigned density.

For a segment containing n non-intersecting mass objects of volumetric domain $V_1, \ldots, V_n$, its mass properties are:

$$\text{volume} = \sum_{i=1}^{n} \int_{V_i} dV \tag{1}$$

$$\text{mass} = \sum_{i=1}^{n} \rho_i \int_{V_i} dV \tag{2}$$

$$COM = \frac{1}{\text{mass}} \sum_{i=1}^{n} \rho_i \left( \int_{V_i} x dV, \int_{V_i} y dV, \int_{V_i} z dV \right)^T \tag{3}$$

$$I = \sum_{i=1}^{n} \rho_i \begin{pmatrix} \int_{V_i} (y^2 + z^2) dV & -\int_{V_i} xy dV & -\int_{V_i} xz dV \\ -\int_{V_i} xy dV & \int_{V_i} (x^2 + z^2) dV & -\int_{V_i} yz dV \\ -\int_{V_i} xz dV & -\int_{V_i} yz dV & \int_{V_i} (x^2 + y^2) dV \end{pmatrix} \tag{4}$$

where $\rho_i$ is the density of mass object i, dV is a differential volume element, and x, y, z are the spatial coordinates that comprise the volume of the segment. The inertia tensor matrix I is symmetrical.

In one embodiment, mass properties for the initial polyhedron are adjusted according to compositing. In order to compute the mass, the mass properties module 218 computes the integrals over the volume of the outer geometric shape from which it subtracts the integrals over the volume of embedded geometric shapes. The individual integrals from the embedded objects with their appropriate densities are then added to yield the nonuniform density of the object or segment as a whole. According to this embodiment, the mass of geometric shape S has a total volume T comprising outer geometric shape A and two embedded geometric shapes B and C:

$$m_s = \rho_A \int_T dV - \left( \rho_A \int_{V_B} dV + \rho_A \int_{V_C} dV \right) + \left( \rho_B \int_{V_B} dV + \rho_C \int_{V_C} dV \right) \tag{5}$$

where the subscripts denote the object. The other integrals in equations (1)-(4) are similarly computed.

For the inertia tensor of the segment, once the integrals are computed, the inertia tensor is transformed to the segment's center of mass using the parallel axis theorem.

$$I_S^{COM} = I_S - m_S \begin{pmatrix} r_y^2 + r_z^2 & r_x r_y & r_x r_z \\ r_x r_y & r_x^2 + r_z^2 & r_y r_z \\ r_x r_z & r_y r_z & r_x^2 + r_y^2 \end{pmatrix} \tag{6}$$

where $m_s$ refers to the mass of the segment S and the coordinates of the center of mass are $r_x$, $r_y$, and $r_z$.

Another aspect according to another embodiment of the present invention includes the mass sets for several segments or objects. According to this embodiment, once the mass properties of a segment are known in its local coordinate system, they can be combined with those of the other segments in an articulated skeleton to compute the total center of mass and inertia tensor for the entire system. According to this embodiment, the total center of mass for a system of n segments can be easily computed as:

$$COM_{system} = \frac{1}{m_{system}} \sum_{i=1}^{n} m_i r_i \tag{7}$$

with $r_i$ being the center of mass for segment I, and $m_i$ being the mass of segment i. Alternatively, according to another embodiment of the invention, the center of mass can subsequently be expressed relative to any arbitrary reference point.

According to another embodiment of the present invention, to calculate the inertia tensor all the tensor matrices should be transformed to be in a common world frame of reference using a similarity transform. In accordance with these principles, a similarity transform in one embodiment of the present invention would be:

$$I_s^{world} = R_s I_s^{com} R_s^T \tag{8}$$

where $R_s$ is the rotation matrix of the segment with respect to the world frame and $I_s^{com}$ is the local segment inertia tensor at its center of mass. In one embodiment of the present invention using applications of the parallel axis theorem, each of the transformed segment inertia tensors are represented with respect to the common world origin so that the matrices can be added together to produce the system inertia tensor. In addition, in this embodiment, the parallel axis theorem can be once again applied to express the system inertia tensor with respect to the system center of mass. Subsequent diagonalization of the inertia tensor matrix using Jacobi rotations can be performed to compute principal moments and axes (the eigenvalues and eigenvectors of the matrix) as shown in for example the Press et al reference included above be reference.

Figure 4:
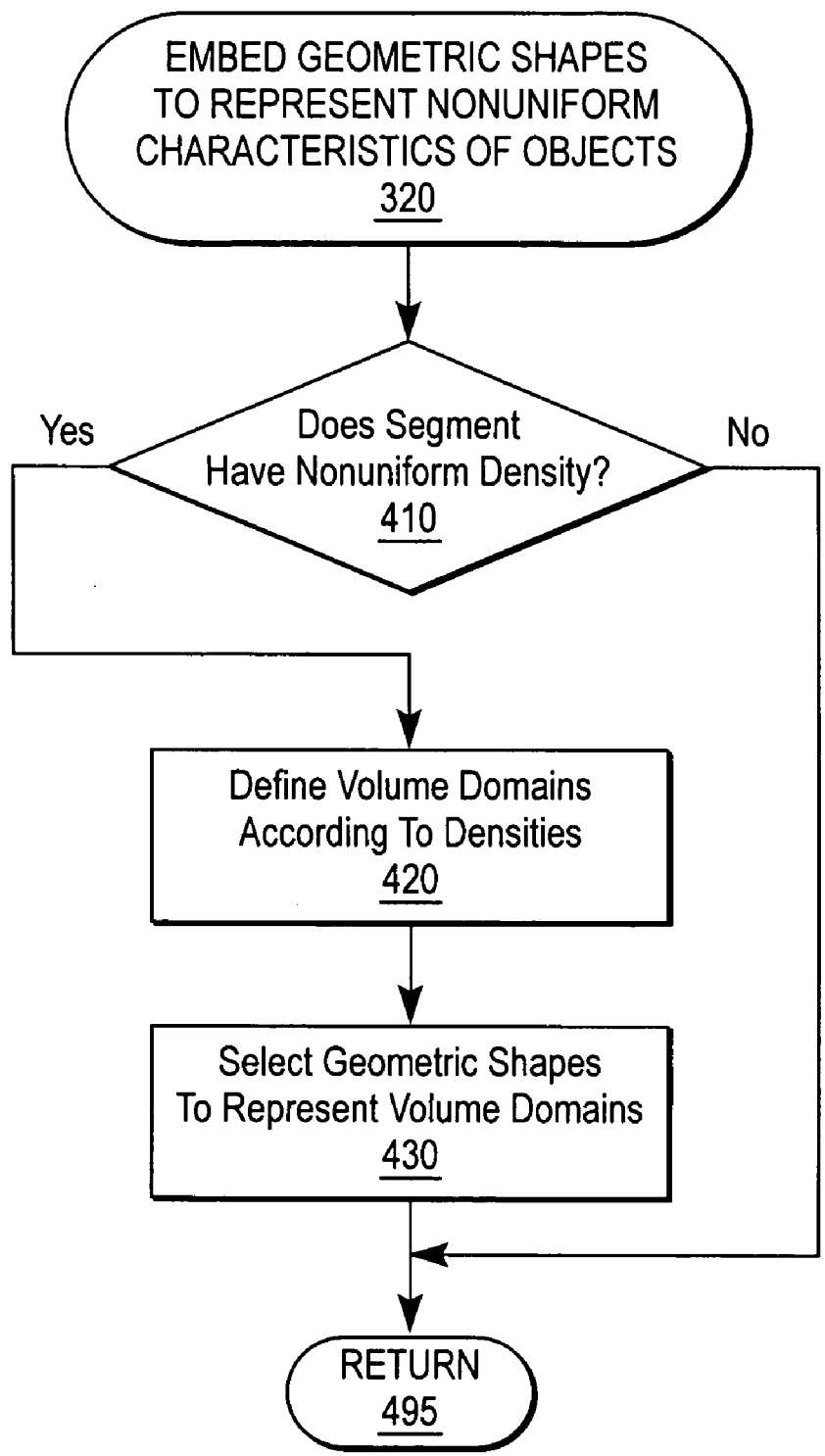
FIG. 4 is a flow chart illustrating a method for embedding geometric shapes to represent nonuniform characteristics of objects according to one embodiment of the present invention.

FIG. 4 is a flow chart illustrating a method 320 for selecting geometric shapes to represent an object of nonuniform density according to one embodiment of the present invention. If the segment has nonuniform density module 410, the compositing module 214 defines 420 volume domains for each density. Regions of density can be identified by noninvasive x-rays, user input, predefined regions (e.g., hollow objects such as a tire with predefined inner volumes), and the like.

Figure 5:
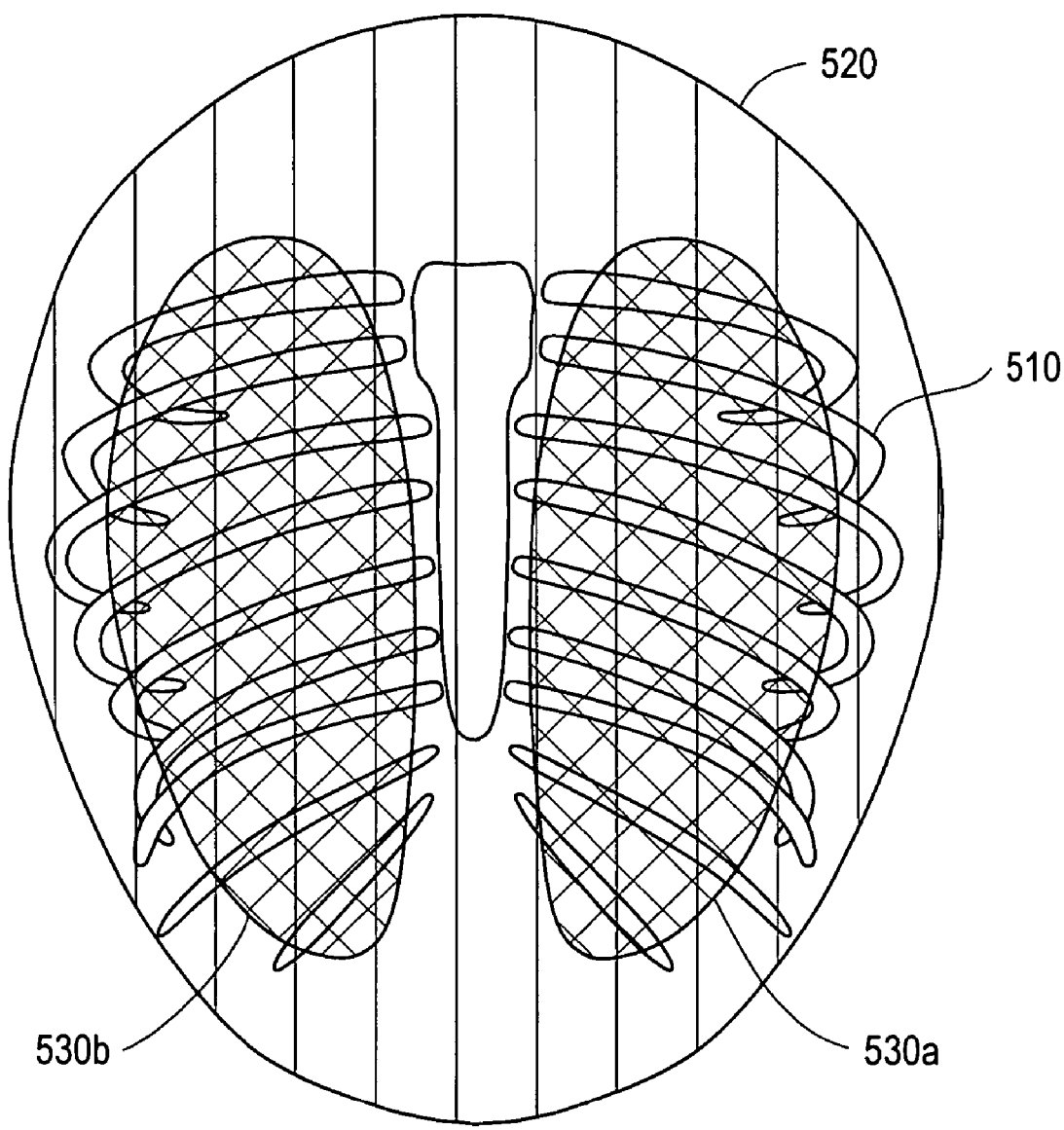
FIG. 5 is an illustration of example embedded geometric shapes representing nonuniform density according to one embodiment of the present invention.

The compositing module 214 embeds 430 geometric shapes to represent volume domains. Similar to the outer geometric shapes selected in step 310, these embedded, or inner, geometric shapes are initially predefined polyhedron shapes. FIG. 5 is an illustration of nonuniform density modeling according to one embodiment of the present invention. A chest cavity 510 is modeled with an outer ellipsoid 520 and embedded ellipsoids 530a-b. While the outer ellipsoid 520 represents an object largely made up of muscle mass, the inner ellipsoids 530a-b represent hollow lungs having negligible density. As a result, the hollowing out of the outer ellipsoid 520 provides a more accurate mass set.

In one embodiment, the inner geometric shapes can also be deformed to tightly fit irregular shapes. In another embodiment, the mass properties module 218 computes a total volume by subtracting inner volumes from an outer volume and assigning individual densities to each of the ellipsoids 510, 520.

If the segment has a uniform density 410, the nonuniform module 216 need not embed an inner geometric shape.

Figure 6:
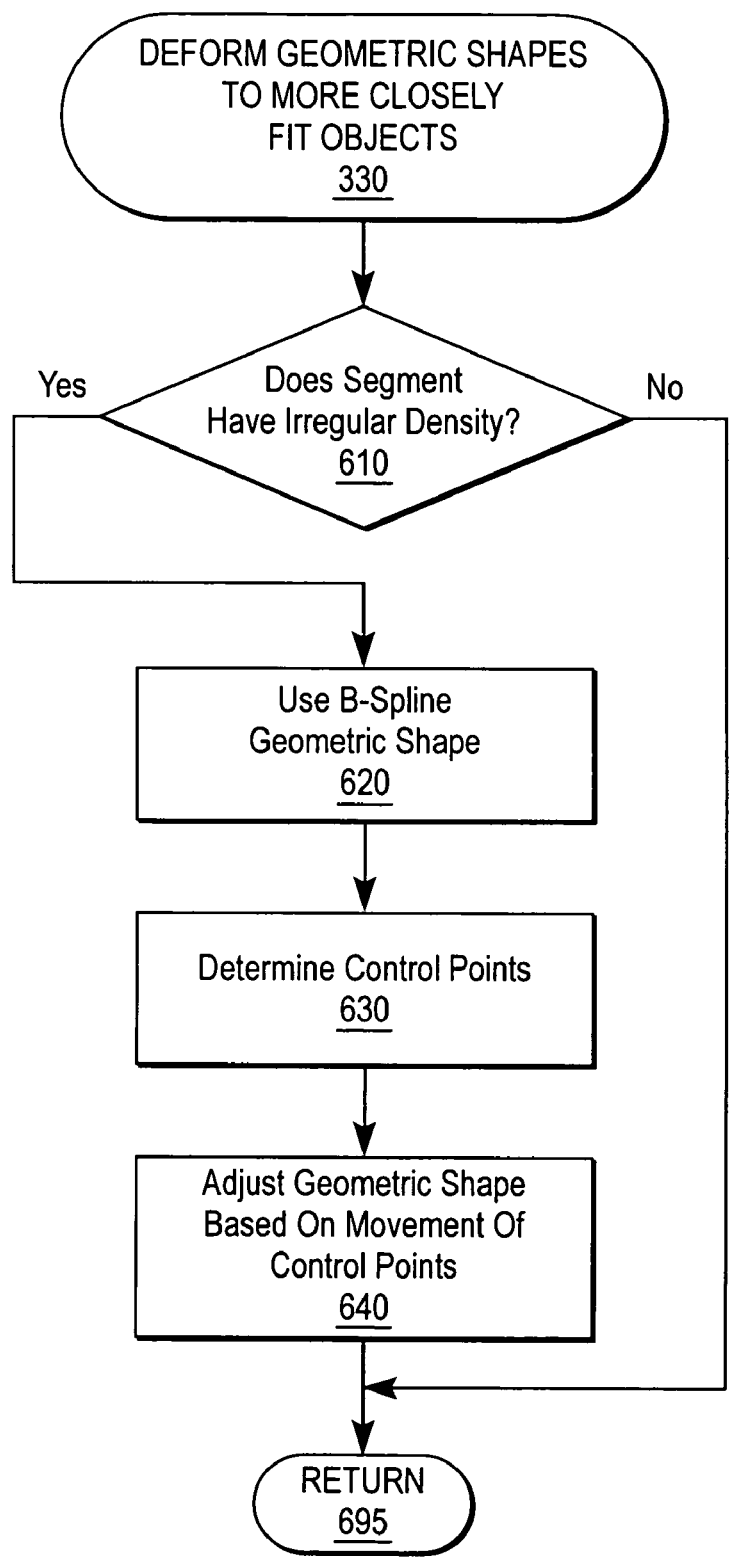
FIG. 6 is a flow chart illustrating a method for adjusting geometric shapes to fit an object according to one embodiment of the present invention.
Figure 7A:
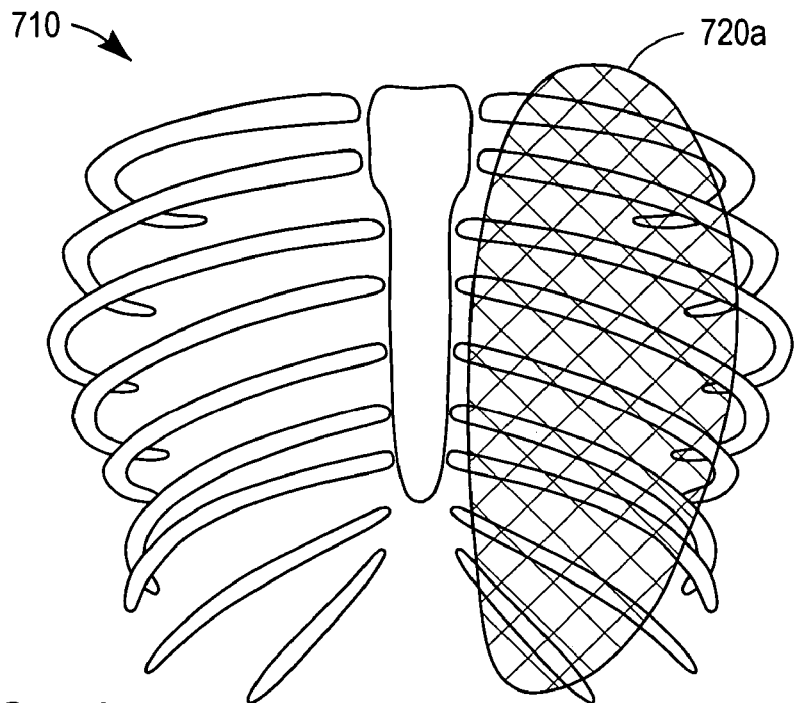
FIGS. 7a-c illustrate shape adjusting to fit objects according to one embodiment of the present invention.

FIG. 6 is a flow chart illustrating a method 330 for adjusting geometric shapes to fit an object according to one embodiment of the present invention. If a segment has an irregular shape 610, the deforming module 216 uses 620a B-spline type of geometric shape to represent the object. FIG. 7a illustrates an ellipsoidal geometric shape 720a representing a right lung segment in a chest cavity object 710 prior to any deformation. As shown, boundaries of the geometric shape 720a fit more closely on its sides than the top and bottom. In one embodiment, the resulting error metric triggers the use of the B-spline geometric shape rather than a rigid polyhedron.

Generally, a B-spline solid is represented by equation (8):

$$V(u, v, w) = \sum_{i=0}^{l} \sum_{j=0}^{m} \sum_{k=0}^{n} B_i^u(u) B_j^v(u) B_k^w(u) C_{ijk} \quad (8)$$

where $C_{ijk}$ forms a set of control point lattice which influences the shape of the B-spline geometric shape. V describes a parametric solid according to the tritensor product of B-spline basis functions $B_i^u(u)$, $B_j^v(u)$, and $B_k^w(u)$.

Figure 7B:
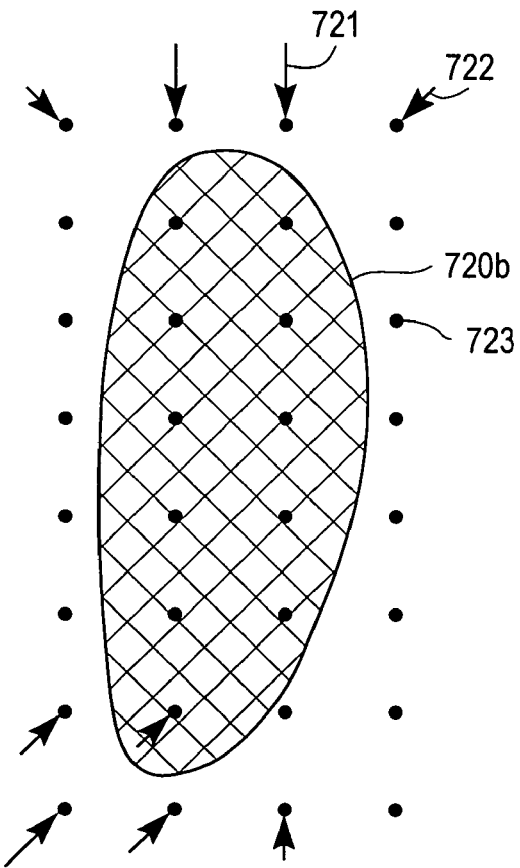

The deforming module 216 determines 630 control points for the geometric shape. FIG. 7b illustrates a B-spline geometric shape 720 including control points 721-723. The lattice of control points are positioned around the ellipsoid surface. The ellipsoid shape alters depending on how much control points 721-723 are adjusted. The amount of control point movement is illustrated by varying arrow lengths. In one embodiment, each control point corresponds to a local surface area of the geometric shape under deformation. As opposed to a global adjustment such as radius or length, these local adjustments can affect a relatively small area akin to shaping dough with a finger. In another embodiment, the each control point affects more than the local surface area, but with diminishing influence with increasing distance. Accordingly, control point 721 has more influence on the surface than control point 722. Control point 723 is not moved, and thus, has no influence on surface deformations. Note, however, that control point 723 preserves the local portion of the original surface that it has influence over.

Figure 7C:
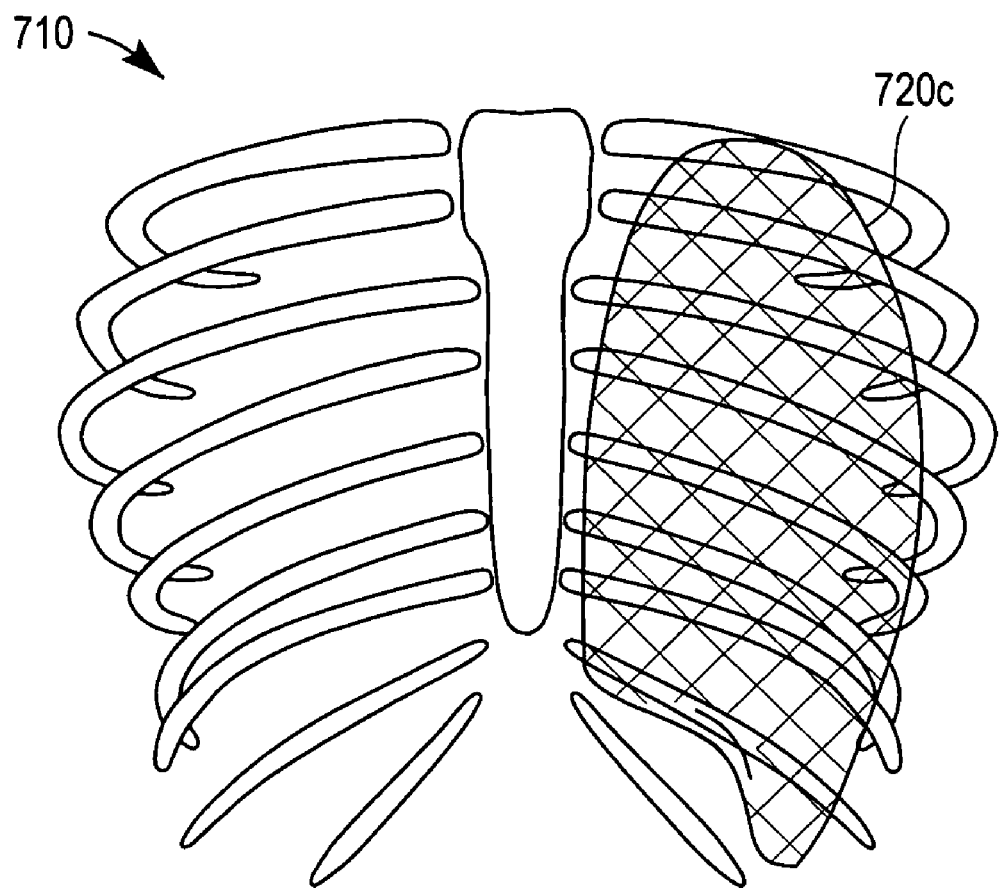

The deforming module 216 locally deforms 640 the geometric shape based on movement of control points. FIG. 7c shows the resulting surface shape as determined by equation (8) above. The B-spline shape 720a allows the deforming module 216 to more closely approximate the effect of lung density on mass properties such as center of mass. In the original B-spline 720a, the center of mass resides in the ellipsoidal center. The center of mass of the modified B-spline 720c resides to the right and slightly above center.

The above description is included to illustrate the operation of the preferred embodiments and is not meant to limit the scope of the invention. The scope of the invention is to instead be limited only by the following claims.

I claim:

1. A method of modeling an object of nonuniform density to determine mass properties of the object, the object having a first portion with a first density, and a second portion with a second density embedded within the first portion, comprising the steps of:

selecting a primary geometric shape corresponding to the first object portion, the primary geometric shape having dimensions representative of a continuous volume of the first object portion;

selecting a secondary geometric shape corresponding to the second object portion embedded within the first object portion, the secondary geometric shape having dimensions representative of a continuous volume of the second object portion;

assigning a first density to the continuous volume of the primary geometric shape and a second density to the continuous volume of the secondary geometric shape; and calculating the mass properties of the object from the continuous volume of the primary geometric shape assigned with the first density and the continuous volume of the secondary geometric shape assigned with the second density, wherein calculating the mass properties of the object comprising the step of:

calculating an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

2. The method of claim 1, wherein the step of selecting the secondary geometric shape comprises selecting a plurality of secondary geometric shapes, each of the plurality of secondary geometric shapes having dimensions representative of separate nonuniform object portions.

3. The method of claim 1, wherein calculating the mass properties of the object comprising the step of:

calculating a mass set property based on the primary geometric shape dimensions, the secondary geometric shape dimensions, the first density, and the second density.

4. The method of claim 1, wherein calculating the mass properties of the object comprising the step of:
calculating a center of mass of the object.

5. The method of claim 1, wherein calculating the mass properties of the object comprising the step of:
calculating an inertia tensor of the object.

6. The method of claim 1, wherein the primary geometric shape comprises a polyhedron shape.

7. The method of claim 1, further comprising:
deforming the primary geometric shape to more closely fit the object portion, wherein the primary geometric shape comprises a B-spline solid having control points.

8. A method of modeling an object of irregular shape to determine mass properties of the object, comprising the steps of:
selecting a plurality of geometric shapes, each geometric shape corresponding to a portion of the object, and having dimensions representative of a continuous volume of the object portion and control points;
adjusting a control point to deform each of the geometric shape to more closely match the object portion;
assigning a different density to each geometric shape; and
calculating the mass properties from continuous volumes of the plurality of deformed geometric shapes assigned with different densities, wherein calculating the mass properties of the object further comprising the step of:
calculating an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

9. The method of claim 8, wherein calculating the mass properties comprises:
calculating a center of mass of the object.

10. The method of claim 8, wherein calculating the mass properties comprises:
calculating an inertia tensor of the object.

11. The method of claim 8, wherein the step of adjusting the control point comprises adjusting a control point corresponding to a local portion of the geometric shape to locally deform the geometric shape to more closely match the object portion.

12. The method of claim 8, wherein the geometric shape initially comprises a predefined polyhedron shape.

13. The method of claim 8, wherein the geometric shape comprises a B-spline solid.

14. A device for modeling an object of nonuniform density to determine mass properties of the object, the object having a first portion with a first density, and a second portion with a second density within the first portion, comprising the a processor and a memory having stored thereon:
a partitioning module to select a primary geometric shape corresponding to the first object portion, the primary geometric shape having dimensions representative of the first object portion;
a compositing module to select a secondary geometric shape corresponding to the second object portion, the secondary geometric shape within the primary geometric shape and having dimensions representative of the second object portion; and
a mass properties module to assign a first density to a continuous volume of the primary geometric shape and a second density to a continuous volume of the secondary geometric shape, the mass properties module calculating the mass properties of the object from the continuous volume of the primary geometric shape assigned with the first density and the continuous volume of the secondary geometric shape assigned with the second density, wherein the mass properties module further calculates an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

15. The device of claim 14, wherein the compositing module selects a secondary geometric shape comprises selecting a plurality of secondary geometric shapes, each of the plurality of secondary geometric shapes having dimensions representative of separate nonuniform object portions.

16. The device of claim 14, wherein the mass properties module calculates a mass set property based on the primary geometric shape dimensions, the secondary geometric shape dimensions, the first density, and the second density.

17. The device of claim 14, wherein the mass properties module calculates a center of mass of the object.

18. The device of claim 14, wherein the mass properties module calculates an inertia tensor of the object.

19. The device of claim 14, wherein the primary geometric shape comprises a polyhedron shape.

20. The device of claim 14, further comprising:
a deforming module to deform the primary geometric shape to more closely fit the object portion, wherein the primary geometric shape comprises a B-spline solid having control points.

21. A device for modeling an object of irregular shape to determine mass properties of the object, comprising the a processor and a memory having stored thereon:
a partitioning module to select a plurality of geometric shapes having continuous volumes, each geometric shape corresponding to a portion of the object and having dimensions representative of a volume of the object portion and control points;
a deforming module to adjust a control point to deform each geometric shape to more closely match the object portion; and
a mass properties module to assign a density to the geometric shape and calculate the mass properties from the continuous volumes of the plurality of deformed geometric shapes assigned with different densities, wherein the mass properties module further calculates an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

22. The device of claim 21, wherein the mass properties module calculates a center of mass of the object.

23. The device of claim 21, wherein the mass properties module calculates an inertia tensor of the object.

24. The device of claim 21, wherein the geometric shape comprises a B-spline solid.

25. The device of claim 21, wherein the geometric shape comprises a polyhedron shape.

26. A computer product, comprising:
a computer-storage medium having computer program instructions and data embodied thereon for a method of modeling an object of nonuniform density to determine mass properties of the object, the object having a first portion with a density, and a second portion with a second density embedded within the first portion, comprising the steps of:

selecting a primary geometric shape corresponding to the first object portion, the primary geometric shape having dimensions representative of the first object portion;

selecting a secondary geometric shape corresponding to the second object portion, the secondary geometric shape embedded within the first portion and having dimensions representative of the second object portion;

assigning a first density to a continuous volume of the primary geometric shape and a second density to a continuous volume of the secondary geometric shape; and calculating the mass properties of the object from the continuous volume of the primary geometric shape assigned with the first density and the continuous volume of the secondary geometric shape assigned with the second density, wherein calculating the mass properties of the object further comprising the step of:

calculating an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

27. The computer product of claim 26, wherein the step of selecting a secondary geometric shape comprises selecting a plurality of secondary geometric shapes, each of the plurality of secondary geometric shapes having dimensions representative of separate nonuniform object portions.

28. The computer product of claim 26, further comprising the step of:
calculating a mass set property based on the primary geometric shape dimensions, the secondary geometric shape dimensions, the first density, and the second density.

29. The computer product of claim 26, further comprising the step of:
calculating a center of mass of the object.

30. The computer product of claim 26, further comprising the step of:
calculating an inertia tensor of the object.

31. The computer product of claim 26, wherein the primary geometric shape comprises a polyhedron shape.

32. The computer product of claim 26, further comprising:
deforming the primary geometric shape to more closely fit the object portion, wherein the primary geometric shape comprises a B-spline solid having control points.

33. A computer product, comprising:
a computer-storage medium having computer program instructions and data embodied thereon for a method of modeling an object of irregular shape to determine mass properties of the object, comprising the steps of:
selecting a plurality of geometric shapes having continuous volumes, each geometric shape corresponding to a portion of the object and having dimensions representative of a volume of the object portion and control points;
adjusting a control point to deform each geometric shape to more closely match the object portion;
assigning a different density to a continuous volume of each geometric shape; and
calculating the mass properties from the continuous volumes of the plurality of deformed geometric shapes assigned with different densities, wherein calculating the mass properties of the object further comprising the step of:
calculating an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

34. A device for modeling an object of nonuniform density to determine mass properties of the object, comprising the a processor and a memory having stored thereon:
means for selecting a primary geometric shape corresponding to a portion of the object, the primary geometric shape having dimensions representative of a continuous volume of the object portion;
means for selecting a secondary geometric shape to represent a nonuniform density within the object portion, the secondary geometric shape having dimensions representative of a continuous volume of the nonuniform object portion;
means for assigning a first density to the continuous volume of the primary geometric shape and a second density to the continuous volume of the secondary geometric shape; and
means for calculating the mass properties of the object from the continuous volume of the primary geometric shape assigned with the first density and the continuous volume of the secondary geometric shape assigned with the second density, wherein the means for calculating the mass properties of the object further calculates an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

35. A device for modeling an object of irregular shape to determine mass properties of the object, comprising a processor and a memory having stored thereon:
means for selecting a plurality of geometric shapes, each geometric shape corresponding to a portion of the object and having dimensions representative of a continuous volume of the object portion and control points;
means for adjusting a control point to deform each geometric shape to more closely match the object portion;
means for assigning a different density to each geometric shape; and
means for calculating the mass properties from the continuous volumes of the plurality of deformed geometric shapes assigned with different densities, wherein the means for calculating the mass properties of the object further calculates an object mass by subtracting a third mass from a first mass and adding a second mass, the first mass derived from the first density and the volume of the first object portion, the second mass derived from the second density and the volume of the second object portion, and the third mass derived from the first density and the volume of the second object portion.

* * * * *

UNITED STATES PATENT AND TRADEMARK OFFICE
CERTIFICATE OF CORRECTION

PATENT NO. : 7,409,322 B2 Page 1 of 1
APPLICATION NO. : 10/877713
DATED : August 5, 2008
INVENTOR(S) : Victor Ng-Thow-Hing It is certified that error appears in the above-identified patent and that said Letters Patent is hereby corrected as shown below:

In claim 8, Column 9, Line 17, delete comma (,) after "of the object"

In claim 14, Column 9, Line 52, delete "the" after "comprising"

In claim 21, Column 10, Line 33, delete "the" after "comprising"

In claim 34, Column 12, Line 12, delete "the" after "comprising"

Signed and Sealed this

Third Day of March, 2009

JOHN DOLL
*Acting Director of the United States Patent and Trademark Office*